(12) United States Patent
Kim et al.

(10) Patent No.: US 11,212,949 B2
(45) Date of Patent: Dec. 28, 2021

(54) SOLID STATE DRIVE DEVICE INCLUDING A GASKET

(71) Applicant: SAMSUNG ELECTRONICS CO., LTD., Suwon-si (KR)

(72) Inventors: Ji Yong Kim, Hwaseong-si (KR); Sunk-Ki Lee, Seoul (KR); Su In Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/824,305

(22) Filed: Mar. 19, 2020

(65) Prior Publication Data

US 2021/0037685 A1 Feb. 4, 2021

(30) Foreign Application Priority Data

Jul. 29, 2019 (KR) .................. 10-2019-0091713

(51) Int. Cl.
| | |
|---|---|
| *H05K 5/02* | (2006.01) |
| *H05K 9/00* | (2006.01) |
| *H05K 5/00* | (2006.01) |
| *H05K 5/03* | (2006.01) |
| *H05K 7/20* | (2006.01) |

(52) U.S. Cl.
CPC ......... *H05K 9/0015* (2013.01); *H05K 5/0008* (2013.01); *H05K 5/026* (2013.01); *H05K 5/03* (2013.01); *H05K 7/2039* (2013.01)

(58) Field of Classification Search
CPC ..... H05K 9/0015; H05K 9/0016; H05K 5/026
See application file for complete search history.

(56) References Cited

U.S. PATENT DOCUMENTS

| | | | | |
|---|---|---|---|---|
| 5,170,009 | A * | 12/1992 | Kadokura | C09D 5/448 174/363 |
| 5,511,798 | A | 4/1996 | Kawamoto et al. | |
| 6,246,566 | B1 | 6/2001 | Glenn | |
| 7,043,280 | B1 * | 5/2006 | Shields | H01Q 1/246 343/700 MS |
| 7,517,252 | B2 | 4/2009 | Ni et al. | |
| 8,618,426 | B2 * | 12/2013 | Malone | H05K 9/0045 174/382 |
| 8,740,646 | B2 | 6/2014 | Lang et al. | |
| 9,709,295 | B2 | 7/2017 | Adamik et al. | |

(Continued)

FOREIGN PATENT DOCUMENTS

| | | |
|---|---|---|
| KR | 10-2015-0027593 | 3/2015 |
| KR | 10-2015-0099326 | 6/2015 |
| KR | 10-2016-0059839 | 5/2016 |

*Primary Examiner* — Hung V Ngo
(74) *Attorney, Agent, or Firm* — F. Chau & Associates, LLC

(57) ABSTRACT

A solid state drive device is provided. The solid state drive device includes a lower plate which includes a lower flat part, and a lower side wall protruding from the lower flat part primarily in a first direction, an upper plate which includes an upper flat part facing the lower flat part, and an upper side wall protruding from the upper flat part primarily in a second direction opposite to the first direction. The solid state drive device further includes a gasket including a metal material formed in at least a part of a region in which the lower side wall and the upper side wall overlap each other.

18 Claims, 20 Drawing Sheets

(56) References Cited

U.S. PATENT DOCUMENTS

| | | | |
|---|---|---|---|
| 2003/0037943 A1* | 2/2003 | Jensen | H05K 9/0015 |
| | | | 174/355 |
| 2004/0020672 A1* | 2/2004 | Lessard | H05K 9/0073 |
| | | | 174/378 |
| 2010/0149781 A1* | 6/2010 | Wu | H05K 9/0009 |
| | | | 361/818 |
| 2012/0170162 A1 | 7/2012 | Fang et al. | |
| 2015/0351207 A1 | 12/2015 | Tung et al. | |
| 2017/0303447 A1 | 10/2017 | Allenberg | |
| 2018/0081408 A1* | 3/2018 | Lilje | H01R 12/7076 |

\* cited by examiner

SOLID STATE DRIVE DEVICE INCLUDING A GASKET

This application claims priority to Korean Patent Application No. 10-2019-0091713, filed on Jul. 29, 2019, and all the benefits accruing therefrom under 35 U.S.C. § 119, the disclosure of which is incorporated by reference herein in its entirety.

TECHNICAL FIELD

The present invention relates to a solid state drive device, and more specifically, to a solid state drive device including a gasket.

DISCUSSION OF THE RELATED ART

A solid state drive (SSD) device is a next generation storage device that replaces a hard disk drive. The solid state drive device is a storage device based on a non-volatile memory. As compared with traditional hard disk drives, solid state drive devices have low power consumption and high storage density. Further, solid state drive devices may offer high-speed input/output and large capacities, as compared with traditional hard disk drives.

These and other properties may make solid state drives well suited for incorporation into high performance electronic devices. However, electronic devices may generate electromagnetic waves that may interfere with the ability of solid state drive devices to accurately store and maintain data. Therefore, solid state drive devices may be shielded from EMI (Electro Magnetic Interference.

SUMMARY

A solid state drive device includes a lower plate which includes a lower flat part, and a lower side wall protruding from the lower flat part in a first direction. An upper plate includes an upper flat part facing the lower flat part, and an upper side wall protruding from the upper flat part in a second direction opposite to the first direction. A gasket includes a metal material formed in at least a part of a region in which the lower side wall and the upper side wall overlap each other.

A solid state drive device includes a package module. An upper plate is formed on one face of the package module and the upper plate surrounds at least a part of the package module. A lower plate is formed on a face facing the one face of the package module and the lower plate surrounds at least a part of the package module. A gasket including a metal material is formed in at least a part of a region in which the upper plate and the lower plate overlap each other, on a side wall perpendicular to the one face and a back face of the package module.

A solid state drive device includes a lower plate which includes a lower flat part, a first lower side wall and a second lower side wall protruding from the lower flat part in a first direction. First and second lower bent parts are connected to both ends of the first lower side wall. Third and fourth lower bent parts are connected to both ends of the second lower side wall. First and second screw accommodating parts are formed on the first lower side wall. Third and fourth screw accommodating parts are formed on the second lower side wall. A lower support part is formed between the second lower bent part and the fourth lower bent part. A package module includes first to fourth screw passage parts configured to accommodate the first to fourth screw accommodating parts, respectively. An upper package substrate includes a first semiconductor chip and a second semiconductor chip on both faces. A lower package substrate faces the upper package substrate and includes a third semiconductor chip and a fourth semiconductor chip on both faces. Upper and lower connecting members are configured to connect the upper package substrate and the lower package substrate. The package module is disposed on the lower plate. An upper plate includes an upper flat part including first to fourth screw holes formed on each of the first to fourth screw accommodating parts. A first upper side wall and a second upper side wall protrude from the upper flat part in a second direction opposite to the first direction. First and second upper bent parts are connected to both ends of the first upper side wall. Third and fourth upper bent parts are connected to both ends of the second upper side wall. An upper support part is formed between the second upper bent part and the fourth upper bent part. The upper plate is disposed on the package module. A top cover is disposed on the upper plate. A gasket includes a metal material formed on at least some parts of the first and second lower side walls and the first and second upper side walls.

BRIEF DESCRIPTION OF THE DRAWINGS

The above and other aspects and features of the present inventive concept will become more apparent by describing in detail exemplary embodiments thereof with reference to the attached drawings, in which:

FIG. 12 is an exemplary rear view illustrating a lower plate of the solid state drive device according to;

DETAILED DESCRIPTION OF THE EMBODIMENTS

Figure 1:
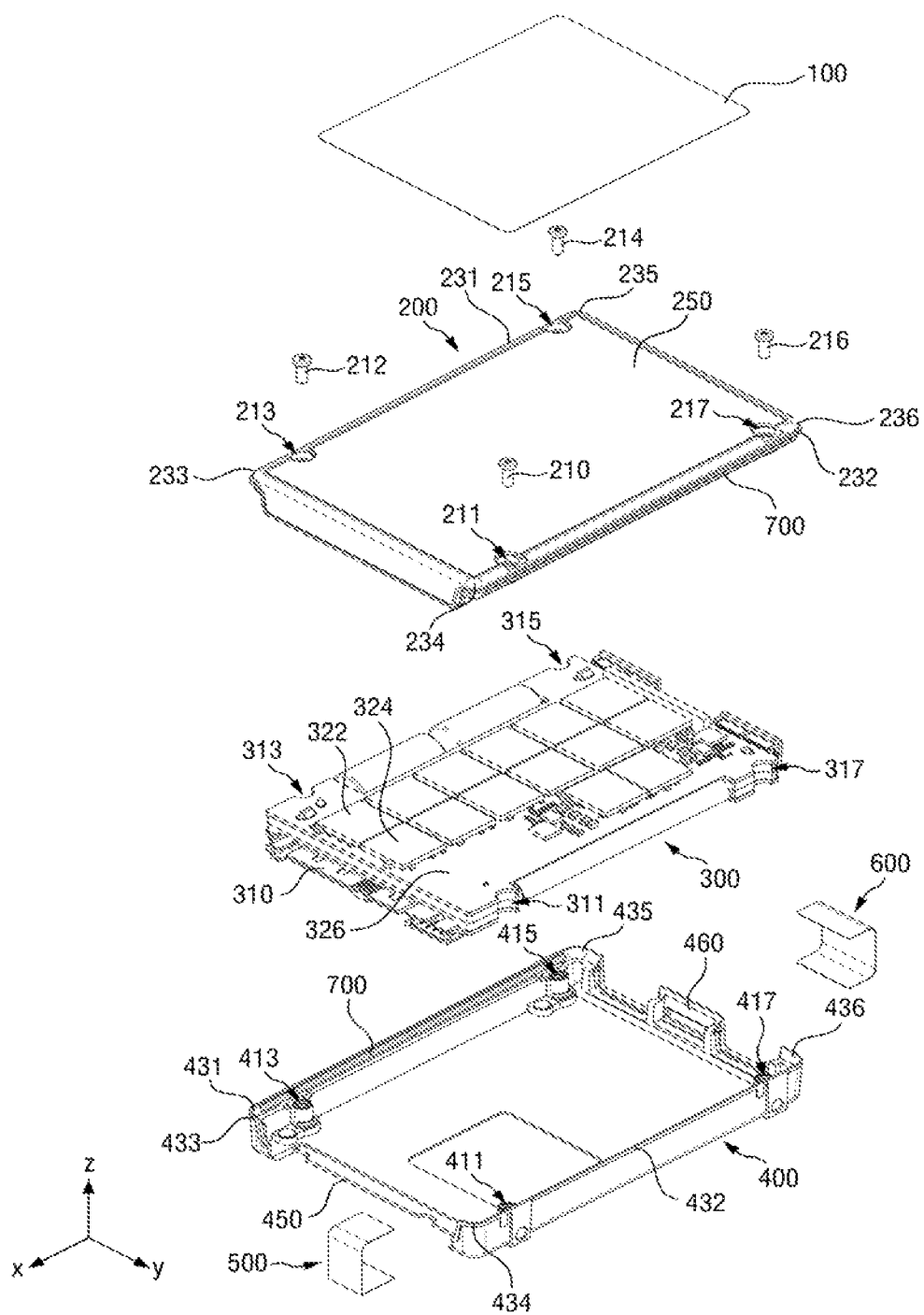
FIG. 1 is an exploded view illustrating a solid state drive device according to exemplary embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
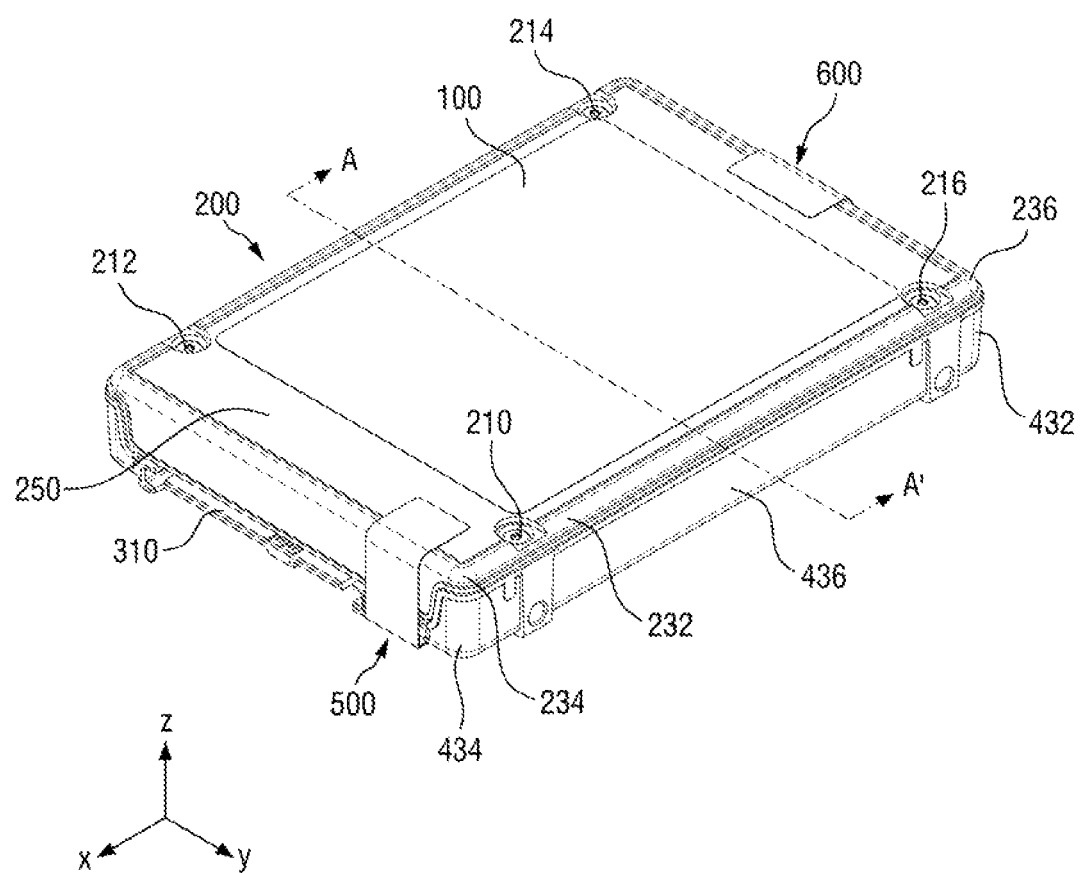
FIG. 2 is a perspective view illustrating a solid state drive device according to exemplary embodiments of the present disclosure.

FIG. 1 is an exploded view illustrating a solid state drive device according to exemplary embodiments of the present disclosure. FIG. 2 is a perspective view illustrating the solid state drive device according to exemplary embodiments of the present disclosure.

Referring to FIGS. 1 and 2, the solid state drive device, according to some exemplary embodiments of the present disclosure includes a top cover 100, an upper plate 200, a lower plate 400, and a package module 300.

The solid state drive device, according to some exemplary embodiments of the present disclosure, includes the top cover 100 on an uppermost face in a first direction (e.g. the positive z direction). The top cover 100 may be disposed on the upper plate 200. The top cover 100 may include, for example, a metal, a carbon-based material or a combination thereof. The metal may include, for example, but is not limited to, copper (Cu), aluminum (Al), zinc (Zn), tin (Sn), stainless steel, and the like. The carbon-based material may be, but is not limited to, graphite, graphene, a carbon fiber, carbon nanotube composite (a CNT composite) or the like.

The solid state drive device, according to some exemplary embodiments of the present disclosure, includes the upper plate 200 that surrounds at least a part of a top face of the package module 300. The upper plate 200 may shield the package module 300, including at least one semiconductor chip (e.g., a first semiconductor chip 322), from external electromagnetic waves. The upper plate 200 may include, for example, a metal, a carbon-based material or a combination thereof. For example, the metal may include, but is not limited to, copper (Cu), aluminum (Al), zinc (Zn), tin (Sn), stainless steel or the like. The carbon-based material may be, but is not limited to, graphite, graphene, carbon fiber, carbon nanotube composite (CNT composite) or the like.

The upper plate 200 includes an upper flat part 250 extending flat in a third direction. The upper flat part 250 may include first to fourth screw holes 211, 213, 215 and 217 through which each of the first to fourth screws 210, 212, 214 and 216 passes. Each of the first to fourth screws 210, 212, 214, and 216 may then pass through first to fourth screw passage parts 311, 313, 315, and 317, and may be fastened to first to fourth screw accommodating parts 411, 413, 415, and 417. The first to fourth screw holes 211, 213, 215, and 217 may be formed at corner parts of the upper plate 200. The position and number of screw holes are not necessarily limited thereto.

A first upper side wall 231 and a second upper side wall 232 protruding in a second direction (e.g. the negative z direction) are included on both side walls of the upper plate 200 or the upper flat part 250. The first upper side wall 231 and the second upper side wall 232 may extend in the third direction (e.g. the positive x direction) along the upper plate 200. Further, the upper plate 200 includes an upper support part 260 (FIG. 7) protruding in the second direction. The first upper side wall 231 includes a first upper bent part 233 (FIG. 7) having a curved face shape at the end in the third direction (e.g. the positive x direction). The first upper side wall 231 also includes a third upper bent part 235 having a curved face shape at the end in a fourth direction (e.g. a negative x direction). Similarly, the second upper side wall 232 includes a second upper bent part 234 having a curved face shape at the end in the third direction (e.g. the positive x direction). The second upper side wall 232 also includes a fourth upper bent part 236 having a curved face shape at the end in the fourth direction (e.g. the negative x direction).

A package module 300 may be disposed under the upper plate 200 (e.g. with respect to the z direction). The package module 300 includes first to fourth screw passage parts 311, 313, 315, and 317 that accommodate the first to fourth screw accommodating parts 411, 413, 415 and 417 of the lower plate 400. The first to fourth screw passage parts 311, 313, 315, and 317 may be in the shape of a recess formed inside the package module 300. The first to fourth screw passage parts 311, 313, 315, and 317 may be formed at corner parts of the package module 300. The position and number of the screw passage parts are not necessarily limited thereto.

The package module 300 may include a first semiconductor chip 322 and/or a third semiconductor chip 342 on the upper package substrate 326. Also, the package module 300 includes an external connector 310.

According to exemplary embodiments of the present disclosure, the external connector 310 may connect the solid state drive device to an external host to transmit and receive signals and/or receive the supply of power. The external connector 310 may be a connector that is configured to be connectable to external devices in a manner that conforms to, for example, a PATA (parallel advanced technology attachment) standard, a SATA (serial advanced technology attachment) standard, a SCSI standard, a PCIe (PCI Express) standard, or the like. Here, the aforementioned SATA standard includes all SATA series standards such as not only SATA-1, but also SATA-2, SATA-3, and e-SATA (external SATA). The aforementioned PCIe standard includes all PCIe series standards such as not only PCIe 1.0, but also PCIe 2.0, PCIe 2.1, PCIe 3.0, and PCIe 4.0. The SCSI standard includes all SCSI series standards such as a parallel SCSI, a serially coupled SA-SCSI (SAS), and iSCSI. In some exemplary embodiments of the present disclosure, the external connector 310 may be a connector configured to support an M2 interface, an mSATA interface, or a 2.5" interface.

Figure 3:
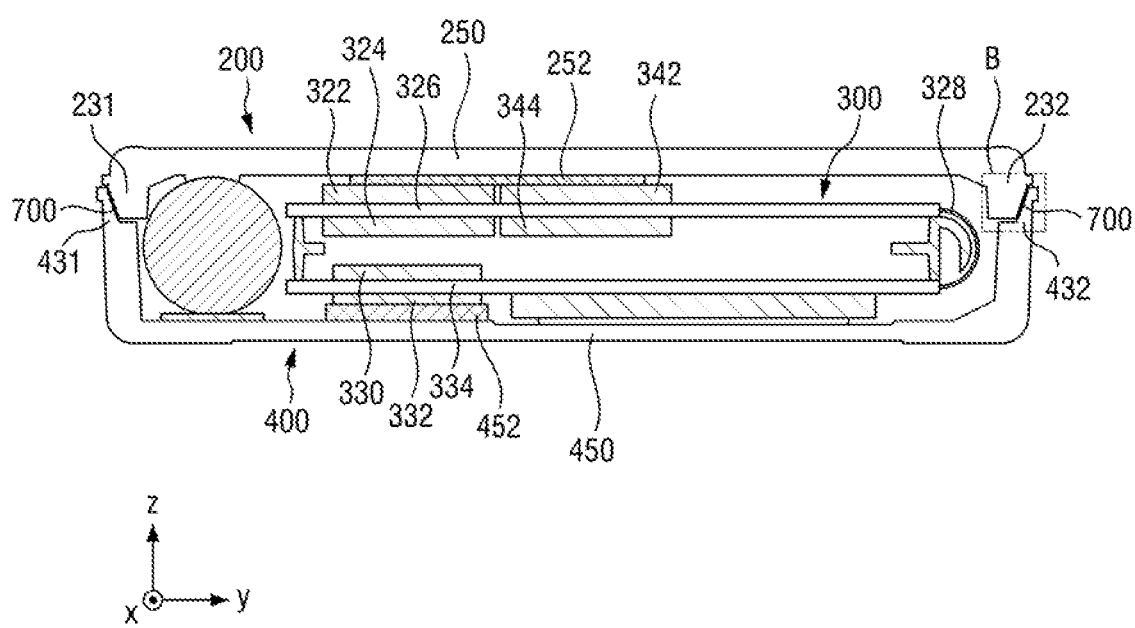
FIG. 3 is a cross-sectional view illustrating the solid state drive device of FIG. 2 according to exemplary embodiments of the present disclosure, taken along a line A-A'.

The remaining detailed explanation of the package module 300 will be provided through FIG. 3.

A lower plate 400 may be disposed under the package module 300. For example, the lower plate 400 may surround the package module 300 together with the upper plate 200, and may shield the package module 300, including at least one semiconductor chip (e.g., the first semiconductor chip 322), from external electromagnetic waves. The lower plate 400 may include, for example, a metal, a carbon-based material or a combination thereof. For example, the metal may include, but is not limited to, copper (Cu), aluminum (Al), zinc (Zn), tin (Sn), stainless steel or the like. The carbon-based material may be, but is not limited to, graphite, graphene, carbon fiber, carbon nanotube composite (CNT composite) or the like.

The lower plate 400 includes a lower flat part 450 extending flat in the third direction. The lower flat part 450 may include first to fourth screw accommodating parts 411, 413, 415, and 417 to which each of first to fourth screws 210, 212, 214, and 216 is fastened. The first to fourth screw accommodating part 411, 413, 415, and 417 may be formed in the corner part of the lower plate 400. The positions and numbers of the screw accommodating parts are not necessarily limited thereto.

A first lower side wall 431 and a second lower side wall 432 protruding in the first direction (e.g. the positive z direction) are included on both side walls of the lower plate 400 or the lower flat part 450. The first lower side wall 431 and the second lower side wall 432 may extend in the third direction (e.g. the positive x direction) along the lower plate 400. Further, the lower plate 400 includes a lower support part 460 protruding in the first direction (e.g. the positive z direction). The first lower side wall 431 includes a first lower bent part 433 having a curved face shape at the end in the third direction (e.g. the positive x direction). The first lower side wall 431 also includes a third lower bent part 435 having a curved face shape at the end in the fourth direction (e.g. the negative x direction). Similarly, the second lower side wall 432 includes a second lower bent part 434 having a curved face shape at the end in the third direction (e.g. the positive x direction). The second lower side wall 432 also includes a fourth lower bent part 436 having a curved face shape at the end in the fourth direction (e.g. the negative x direction).

The solid state drive device, according to exemplary embodiments of the present disclosure, may more firmly fix the upper plate 200 and the lower plate 400 surrounding the package module 300 through a first coupling part 500. Further, the solid state drive device may more firmly fix the upper plate 200 and the lower plate 400 surrounding the package module 300 through a second coupling part 600 disposed at a position facing the first coupling part 500.

The upper plate 200 and the lower plate 400 might not completely shield external electromagnetic waves entering the package module 300. This is because there may be a physical gap that may occur in the coupling process of the upper plate 200 and the lower plate 400. For example, a gap may be formed, while each of the first upper side wall 231 and the second upper side wall 232 of the upper plate 200 meets the first lower side wall 431 and the second lower side wall 432 of the lower plate 400. In addition, a gap may be formed, while each of the first to fourth upper bent parts 233, 234, 235, and 236 of the upper plate 200 meets the first to fourth lower bent parts 433, 434, 435, and 436. Similarly, a gap may be formed, while the upper support part 260 of the upper plate 200 meets the lower support part 460 of the lower plate 400.

Therefore, a gasket 700 may be formed in the aforementioned gap to shield the electromagnetic waves entering due to the gap between the upper plate 200 and the lower plate 400. For example, the gasket 700 may be formed on at least some parts of the first upper side wall 231, the second upper side wall 232, the first to fourth upper bent parts 233, 234, 235, and 236, and the upper support part 260 of the upper plate 200. Also, the gasket may be formed on at least some parts of the first lower side wall 431, the second lower side wall 432, first to fourth lower bent parts 433, 434, 435, and 436, and the lower support part 460 of the lower plate 400. The gasket 700 may also be formed in the package module 300 without being limited thereto.

The gasket 700 of the solid state drive device, according to exemplary embodiments of the present disclosure, may be made of only a metal material. The metal material may be, for example, but is not limited to, titanium, aluminum, pure iron or mild steel.

The gasket 700 of the solid state drive device, according to exemplary embodiments of the present disclosure, may be performed by mixing a metal material and a non-metal material. At this time, the metal material may be, for example, titanium, aluminum, pure iron or mild steel, and the non-metal material may be asbestos, Teflon or graphite. However, the mixture of the metal materials and/or the non-metal materials is not necessarily limited thereto.

Embodiments in which the gasket 700 is formed inside the solid state drive device, according to exemplary embodiments of the present disclosure, will be described in detail with reference to the following drawings. Repeated parts of contents described through FIGS. 1 and 2 will not be described below. It may be assumed that elements that are not described below are at least similar to corresponding elements that have been described elsewhere in the present disclosure.

Figure 4:
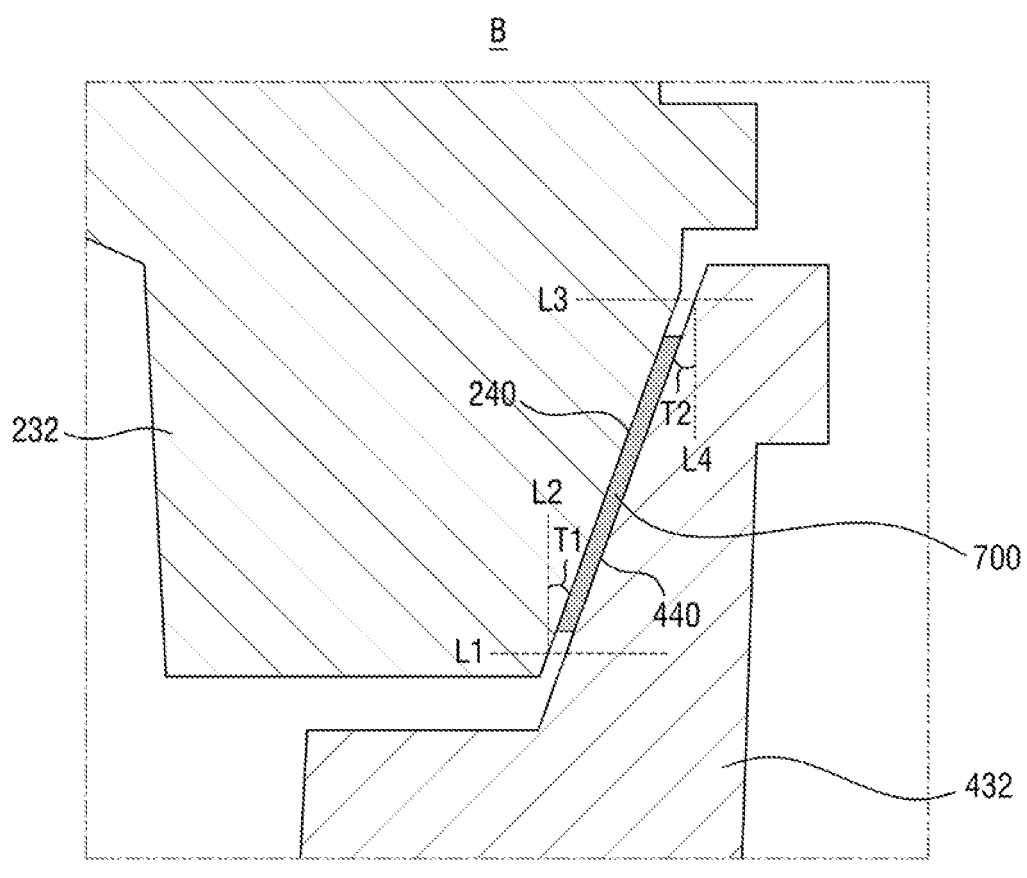
FIG. 4 is an exemplary enlarged view illustrating region B of the solid state drive device of FIG. 3.

FIG. 3 is a cross-sectional view illustrating the solid state drive device of FIG. 2 according to exemplary embodiments of the present disclosure, taken along a line A-A'. FIG. 4 is an exemplary enlarged view in which a region B of the solid state drive device of FIG. 3.

Referring to FIG. 3, the upper plate 200 and the lower plate 400 of the solid state drive device, according to some exemplary embodiments of the present disclosure, may surround the package module 300. The upper plate 200 and the lower plate 400 may shield the package module 300 from external electromagnetic waves.

The package module 300 includes an upper package substrate 326 and a lower package substrate 334. The upper package substrate 326 and the lower package substrate 334 may be electrically connected to each other through an upper and lower connecting member 328. The upper and lower connecting member 328 may be, for example, a film cable.

The upper package substrate 326 and/or the lower package substrate 334 of the solid state drive device, according to exemplary embodiments of the present disclosure, may be, but are not limited to, a printed circuit board (PCB).

A first semiconductor chip 322 and/or a third semiconductor chip 342 may be disposed on an upper face of the upper package substrate 326 of the solid state drive device. A second semiconductor chip 324 and/or a fourth semiconductor chip 344 may be disposed on the lower face of the upper package substrate 326. The number and position of the semiconductor chips arranged on the upper and lower faces of the upper package substrate 326 are not limited to this drawing.

The first to fourth semiconductor chips 344 of the solid state drive device, according to exemplary embodiments of the present disclosure, may be a non-volatile memory element. The first to fourth semiconductor chips 344 may be, for example, but is not limited to, a flash memory, a phase change memory (e.g. a phase change random access memory; PRAM) or a resistive memory (e.g. a resistive random access memory; RRAM).

In addition, a fifth semiconductor chip 332 may be disposed on the upper face of the lower package substrate 334 of the solid state drive device, and a sixth semiconductor chip 330 may be disposed on the lower face of the lower package substrate 334. The number and position of the semiconductor chips arranged on the upper and lower faces of the lower package substrate 334 are not limited to being what is shown in this drawing.

The fifth and/or sixth semiconductor chip 330 of the solid state drive device, according to exemplary embodiments of the present disclosure, may be a buffer memory device. The fifth and/or sixth semiconductor chip 330 may be, for example, but is not limited to, a DRAM (Dynamic Random Access Memory).

The upper plate 200 of the solid state drive device, according to exemplary embodiments of the present disclosure, may include an upper heat transfer member 252 protruding in the second direction (e.g. the negative z direction). The upper heat transfer member 252 may be formed on at least a part of the first semiconductor chip 322 and/or the third semiconductor chip 342.

The lower plate 400 of the solid state drive device, according to exemplary embodiments of the present disclosure, may include a lower heat transfer member 452 protruding in the first direction (e.g. the positive z direction). The lower heat transfer member 452 may be formed on at least a part of the fifth semiconductor chip 332.

Each of the upper heat transfer member 252 and/or the lower heat transfer member 452, according to exemplary embodiments of the present disclosure, may be made of an insulating material or may be made of a material capable of maintaining electrical insulation properties, including the insulating material. The upper heat transfer member 252 and/or the lower heat transfer member 452 may include, for example, an epoxy resin. The upper heat transfer member 252 and/or the lower heat transfer member 452 may also be, for example, mineral oil, grease, gap filler putty, phase change gel, phase change material pads or particle filled epoxy. For example, the commercially available grease may be SHINETSU G750, SHINETSU G751, SHINETSU G765, and/or BERQUIST TIC-7500, the phase change material may be THERMAX HF60110-BT, CHROMERICS T725, CHROMERICS T443, CHROMERICS T454, THERMOGON T-pcm 905c, BERQUIST 200U, BERQUIST HIFLOW 225-U, and/or BERQUIST HIFLOW 225-UT, and thermally conductive adhesive may be CHROMES THERM-A-FORM T642 or the like, but are not limited to these materials.

The upper flat part 250 of the upper plate 200 may protect the upper part of the package module 300 from external electromagnetic waves, and the lower flat part 450 of the lower plate 400 may protect the lower part of the package module 300 from external electromagnetic waves.

The upper plate 200 includes a first upper side wall 231 and a second upper side wall 232 connected to the upper flat part 250 and protruding in the second direction (e.g. the negative z direction). The lower plate 400 includes a first lower side wall 431 and a second lower side wall 432 connected to the lower flat part 450 and protruding in the first direction (e.g. the positive z direction). For example, while the upper plate 200 and the lower plate 400 are coupled to each other, the first upper side wall 231 and the first lower side wall 431 may overlap each other, and the second upper side wall 232 may overlap the second lower side wall 432. Accordingly, the side wall in the fifth direction (e.g. the positive y direction) of the package module 300 may be protected from external electromagnetic waves through the first upper side wall 231 and the first lower side wall 431, and the second upper side wall 232 and the second lower side wall 432.

However, a gap may be generated in a region (for example, a region B) in which the first upper side wall and the first lower side wall overlap and/or a region in which the second upper side wall and the second lower side wall overlap. For example, it may be difficult to completely shield the package module 300 from external electromagnetic waves through coupling of the upper plate 200 and the lower plate 400. This may cause a premature decrease in reliability of the solid state drive device.

Therefore, the gasket 700 may be formed in a gap (e.g., a region B) formed in the solid state drive device according to more efficiently shield external electromagnetic waves that may be received by the package module 300. This will be described in more detail through FIG. 4. Hereinafter, for convenience of explanation, the explanation will focus on the gap generated in the region in which the second upper side wall 232 and the second lower side wall 432 overlap each other. This is because the region in which the first upper side wall 231 and the first lower side wall 431 overlap each other may be described through such a description.

Referring to FIG. 4, the gasket 700 is formed in at least a part of a region in which the second upper side wall 232 and the second lower side wall 432 overlap each other.

As a face area on which the gasket 700 is formed in the region in which the second upper side wall 232 and the second lower side wall 432 overlap is wide, external electromagnetic waves can be more effectively shielded. Accordingly, the second upper side wall 232 and the second lower side wall 432 of the solid state drive device, according to exemplary embodiments of the present disclosure, may form an inclined structure (e.g., a chamfer structure).

In detail, an upper inclined face 240 and a lower inclined face 440 may be formed on each of the second upper side wall 232 and the second lower side wall 432. The upper inclined face 240 may have an inclination of a first angle T1 from a second reference line L2 orthogonal to a first reference line L1 in the first direction (e.g. the positive z direction). The lower inclined face 440 may have an inclination of a second angle T2 from a fourth reference line L4 orthogonal to a third reference line L3 in the second direction (e.g. the negative z direction). The gasket 700 may be formed in a region in which the upper inclined face 240 and the lower inclined face 440 overlap each other. For example, the gasket 700 may be formed in a region that includes 70% or more of the region in which the upper inclined face 240 and the lower inclined face 440 overlap each other. An amount and a position at which the gasket 700 is formed are not limited to what is shown in this drawing.

Figure 5:
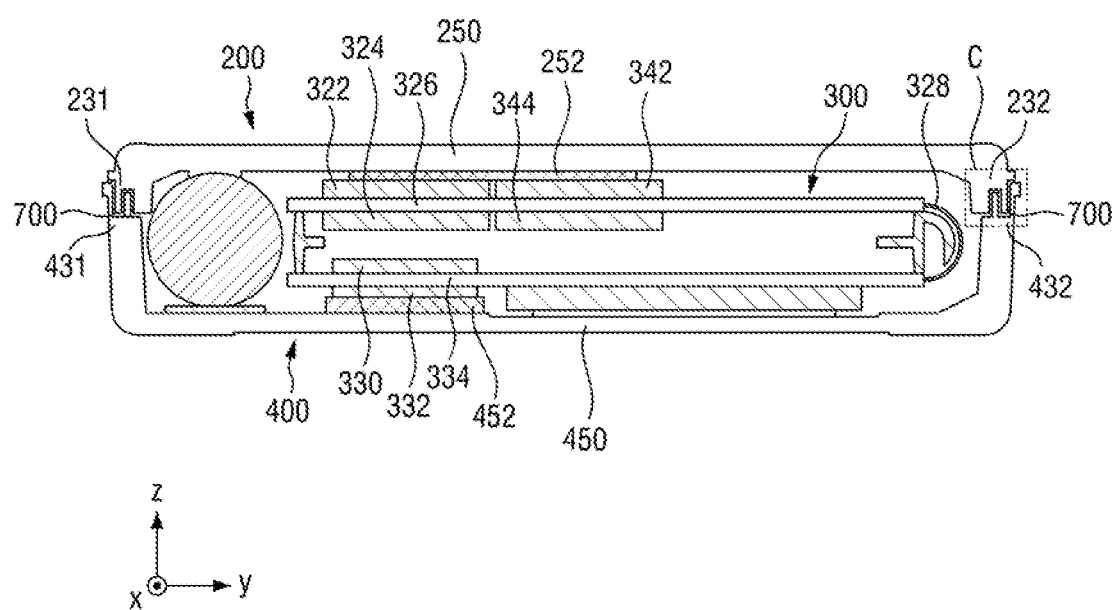
FIG. 5 is a cross-sectional view illustrating the solid state drive device of FIG. 2 according to exemplary embodiments of the present disclosure, taken along a line A-A'.
Figure 6:
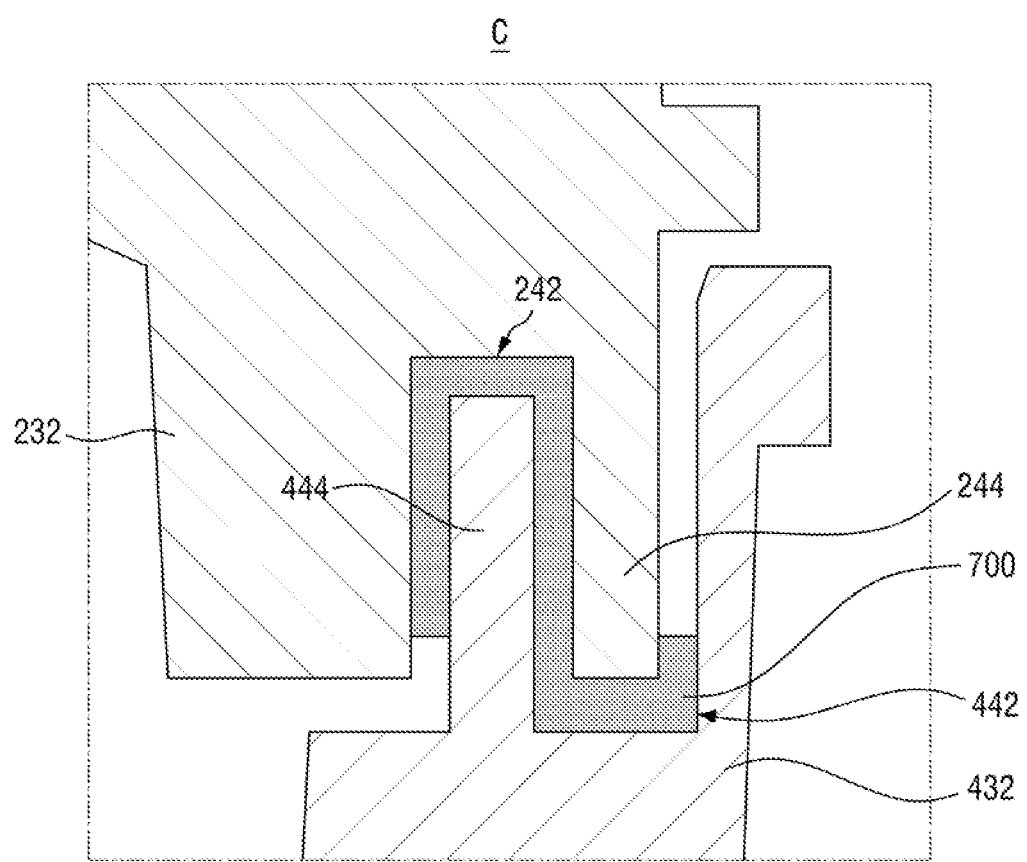
FIG. 6 is an exemplary enlarged view illustrating region C of the solid state drive device of FIG. 5.

FIGS. 5 and 6 show an exemplary embodiment of the present disclosure in which the gasket 700 may be formed with a large face area in the region in which the second upper side wall 232 and the second lower side wall 432 overlap each other. However, the repeated explanation of those mentioned above will not be provided. It may be assumed that elements that are not described below are at least similar to corresponding elements that have been described elsewhere in the present disclosure.

FIG. 5 is a cross-sectional view illustrating the solid state drive device of FIG. 2 according to exemplary embodiments of the present disclosure, taken along a line A-A'. FIG. 6 is an exemplary enlarged view in which a region C of the solid state drive device of FIG. 5.

Referring to FIGS. 5 and 6, the gasket 700 may be formed in a region C in which the second upper side wall 232 and the second lower side wall 432 overlap each other.

As the face area on which the gasket 700 is formed is wide, the external electromagnetic waves can be more efficiently shielded. Accordingly, an upper side wall accommodating part 242 recessed in the first direction (e.g. the positive z direction), and an upper side wall protruding part 244 protruding in the second direction (e.g. the negative z direction) may be formed on the second upper side wall 232. In addition, a lower side wall accommodating part 442 recessed in the second direction (e.g. the negative z direction), and a lower side wall protruding part 444 protruding in the first direction (e.g. the positive z direction) may be formed on the second lower side wall 432.

For example, the lower side wall protruding part 444 may be formed in the upper side wall accommodating part 242, and the upper side wall protruding part 244 may be formed in the lower side wall accommodating part 442. This may increase the face area on which the gasket 700 may be formed (e.g., it may be widened in the shape of villi of a small intestine).

Thicknesses, positions, and number of the side wall accommodating parts and the side wall protruding parts formed on each of the second upper side wall 232 and/or the second lower side wall 432 of the solid state drive device are not necessarily limited thereto.

Hereinafter, the arrangement of the gasket 700 that may be formed on the upper plate 200 and the lower plate 400 of the solid state drive device according to exemplary embodiments of the present disclosure will be described through FIGS. 7 to 17. However, repeated explanation of those mentioned above will not be provided. It may be assumed that elements that are not described below are at least similar to corresponding elements that have been described elsewhere in the present disclosure.

Figure 7:
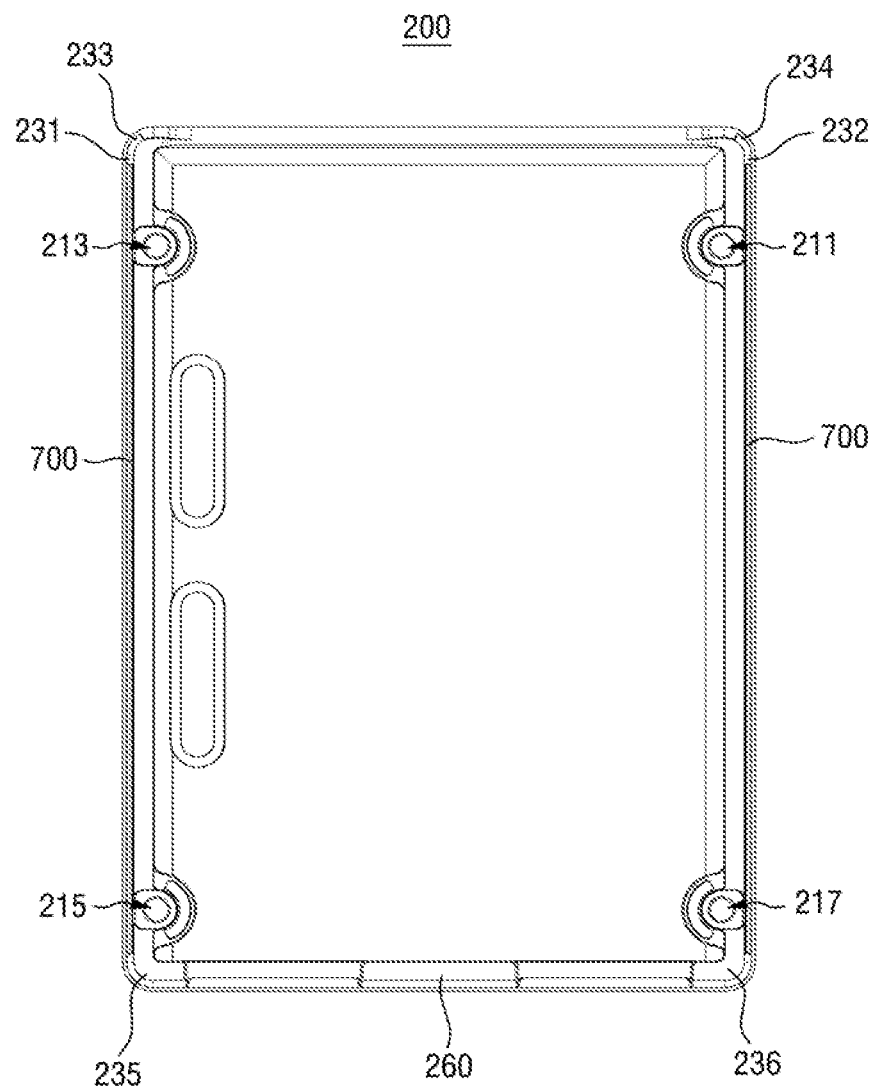
FIG. 7 is an exemplary rear view illustrating an upper plate of the solid state drive device according to exemplary embodiments of the present disclosure.
Figure 8:
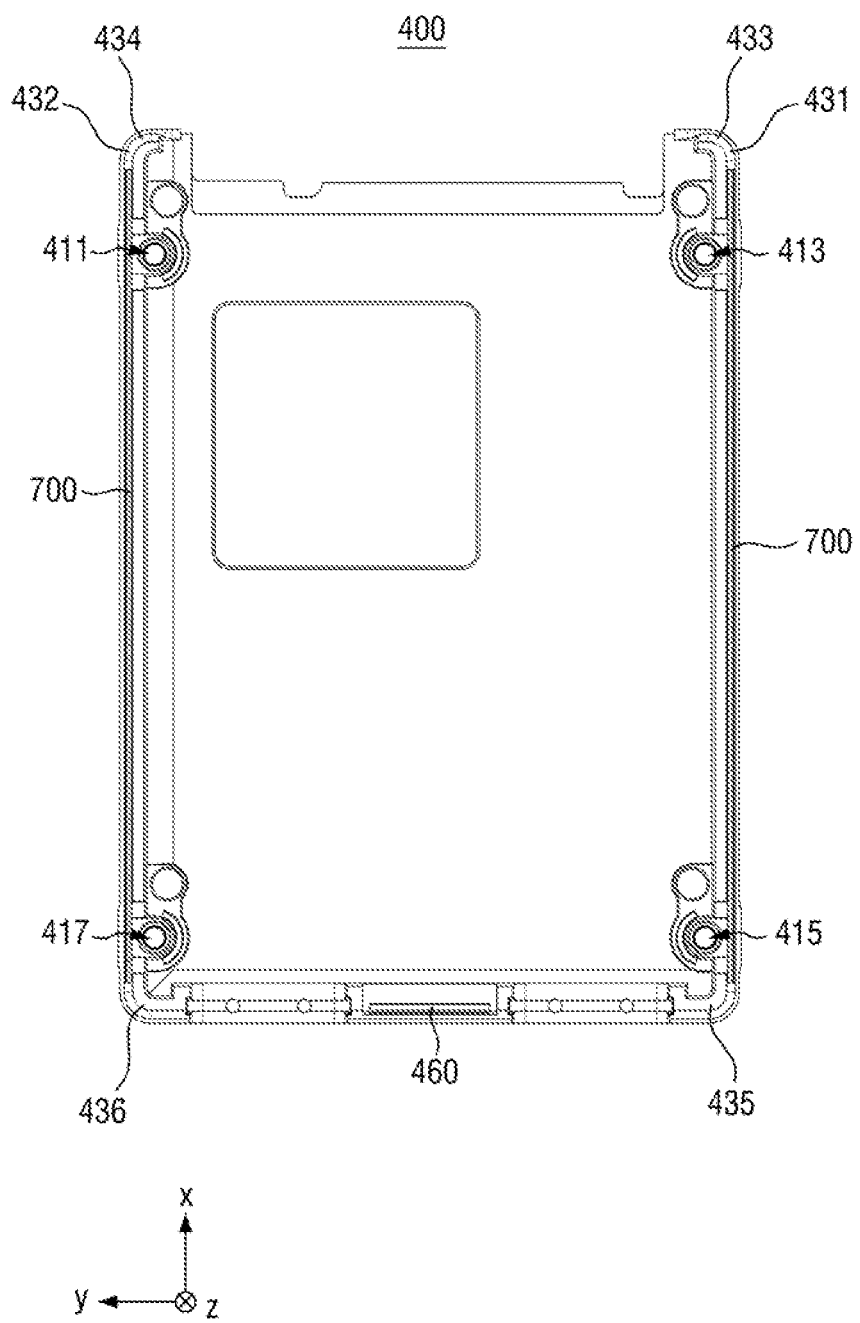
FIG. 8 is an exemplary rear view illustrating a lower plate of the solid state drive device according to exemplary embodiments of the present disclosure.

FIG. 7 is an exemplary rear view illustrating the upper plate of the solid state drive device according to exemplary embodiments of the present disclosure. FIG. 8 is an exemplary rear view illustrating the lower plate of the solid state drive device according to exemplary embodiments of the present disclosure.

Referring to FIGS. 7 and 8, the gasket 700 may be formed on the first upper side wall 231 and the second upper side wall 232. In addition, a gasket 700 may be formed on the first lower side wall 431 and the second lower side wall 432.

The gasket 700, according to exemplary embodiments of the present disclosure, may be formed in regions of 70% or more of each the first upper side wall 231 and the second upper side wall 232. Also, the gasket 700 may be formed in regions of 70% or more of each of the first lower side wall 431 and the second lower side wall 432. This is merely an example, and the region in which the gasket 700 is formed is not necessarily limited thereto.

Also, the cross section of the region in which the first upper side wall 231 and the first lower side wall 431 overlap, and/or the region in which the second upper side wall 232 and the second lower side wall 432 overlap may be formed to increase the face area on which the gasket 700 may be formed, as described above.

Figure 9:
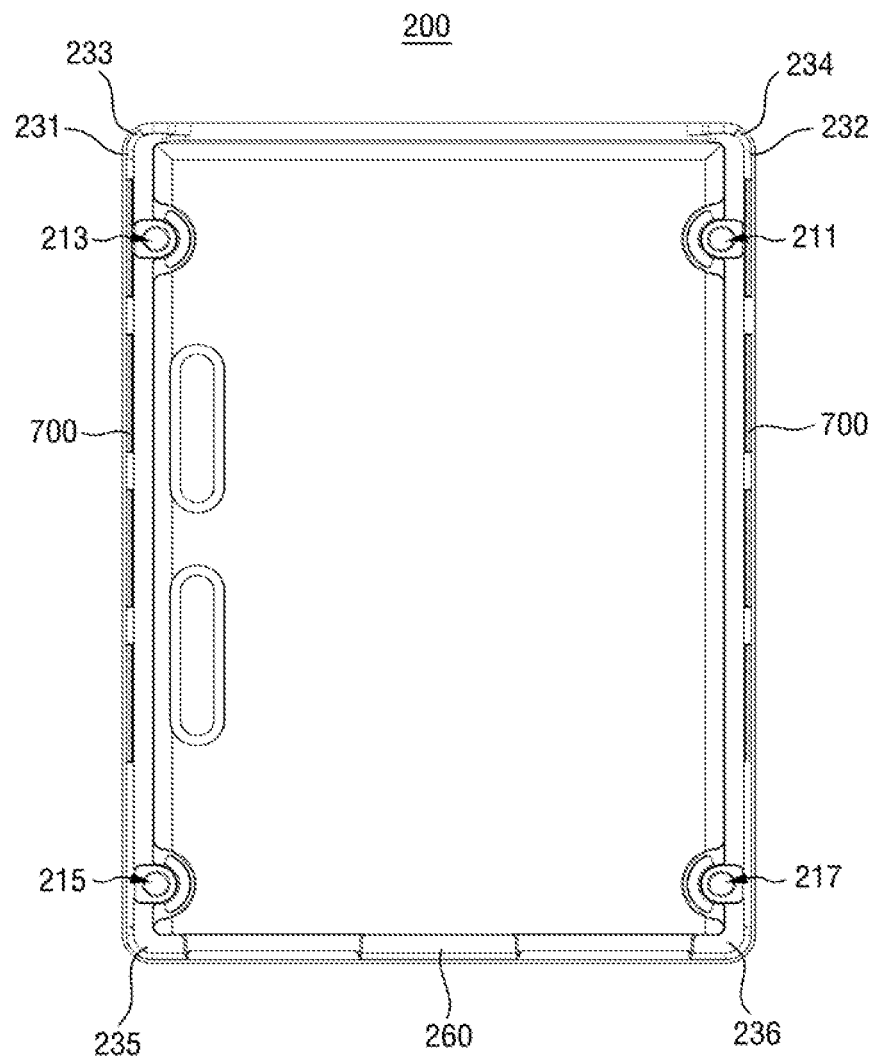
FIG. 9 is an exemplary rear view illustrating an upper plate of the solid state drive device according to exemplary embodiments of the present disclosure.
Figure 10:
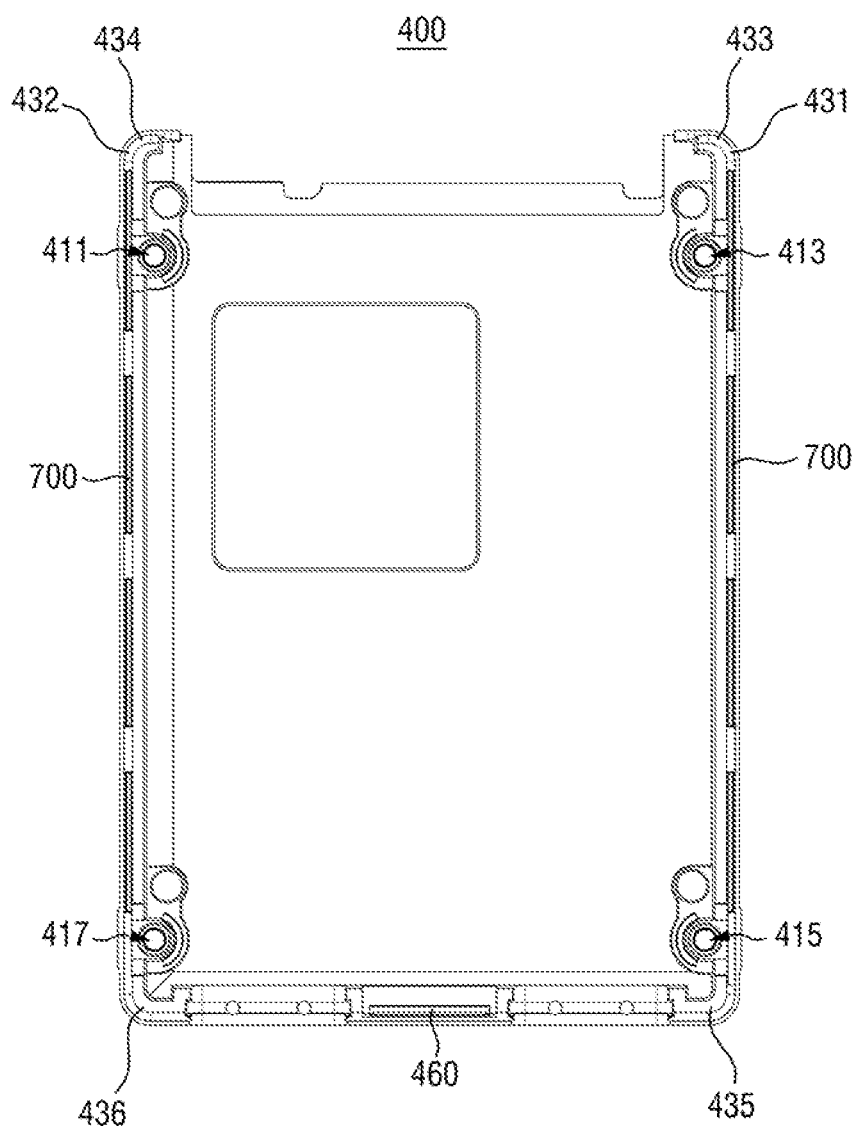
FIG. 10 is an exemplary rear view illustrating a lower plate of the solid state drive device according to exemplary embodiments of the present disclosure.

FIG. 9 is an exemplary rear view illustrating the upper plate of the solid state drive device according to exemplary embodiments of the present disclosure. FIG. 10 is an exemplary rear view illustrating the lower plate of the solid state drive device according to exemplary embodiments of the present disclosure.

Referring to FIGS. 9 and 10, unlike FIGS. 7 and 9, in the structure illustrated in FIGS. 9 and 10, the gasket 700 may be discontinuously formed on the first upper side wall 231, the second upper side wall 232, the first lower side wall 431 and/or the second lower side wall 432.

At this time, the gasket 700, according to exemplary embodiments of the present disclosure, may be formed in regions of 70% or more of each of the first upper side wall 231 and the second upper side wall 232. Also, the gasket 700 may be formed in regions of 70% or more of each of the first lower side wall 431 and the second lower side wall 432. This is merely an example, and the region in which the gasket 700 is formed is not necessarily limited thereto.

Also, the cross section of the region in which the first upper side wall 231 and the first lower side wall 431 overlap, and/or the region in which the second upper side wall 232 and the second lower side wall 432 overlap may be formed to increase the face area on which the gasket 700 may be formed, as described above.

Figure 11:
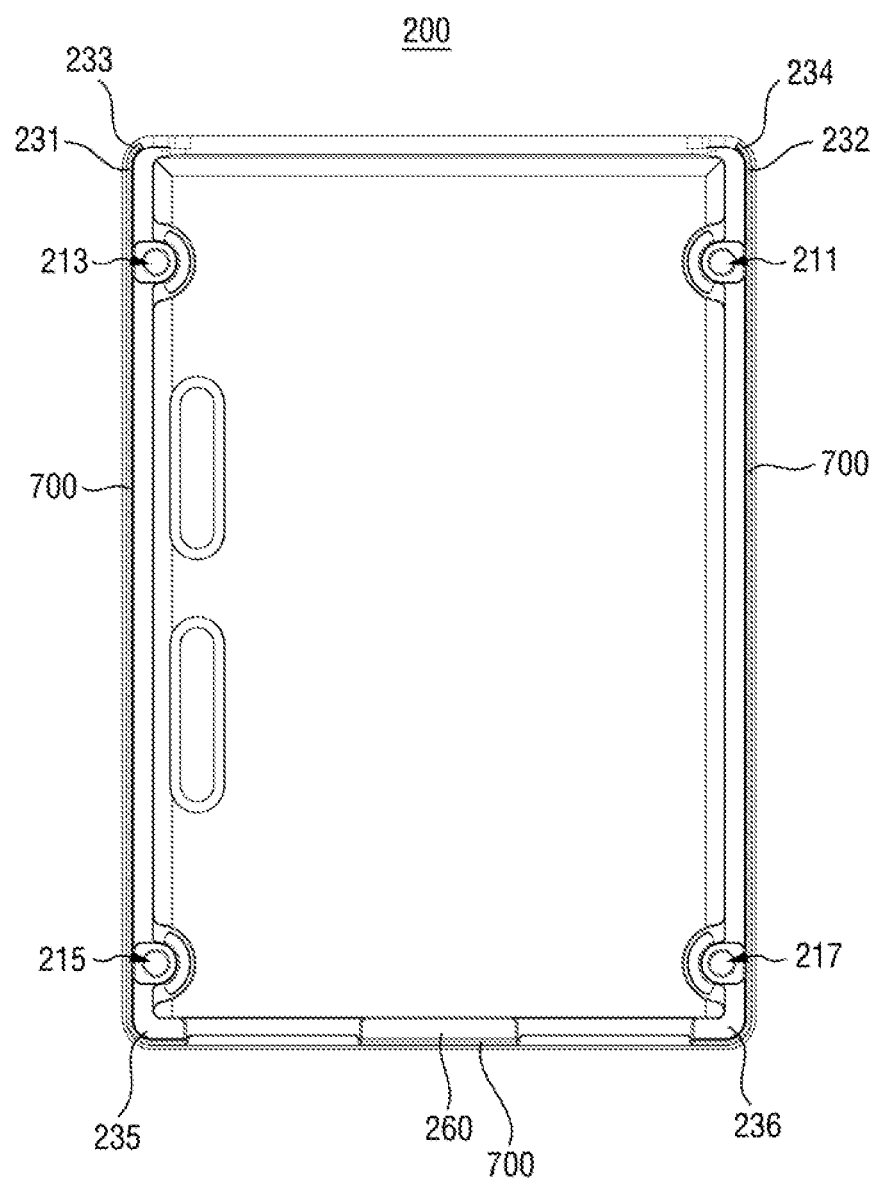
FIG. 11 is an exemplary rear view illustrating an upper plate of the solid state drive device according to exemplary embodiments of the present disclosure.
Figure 12:
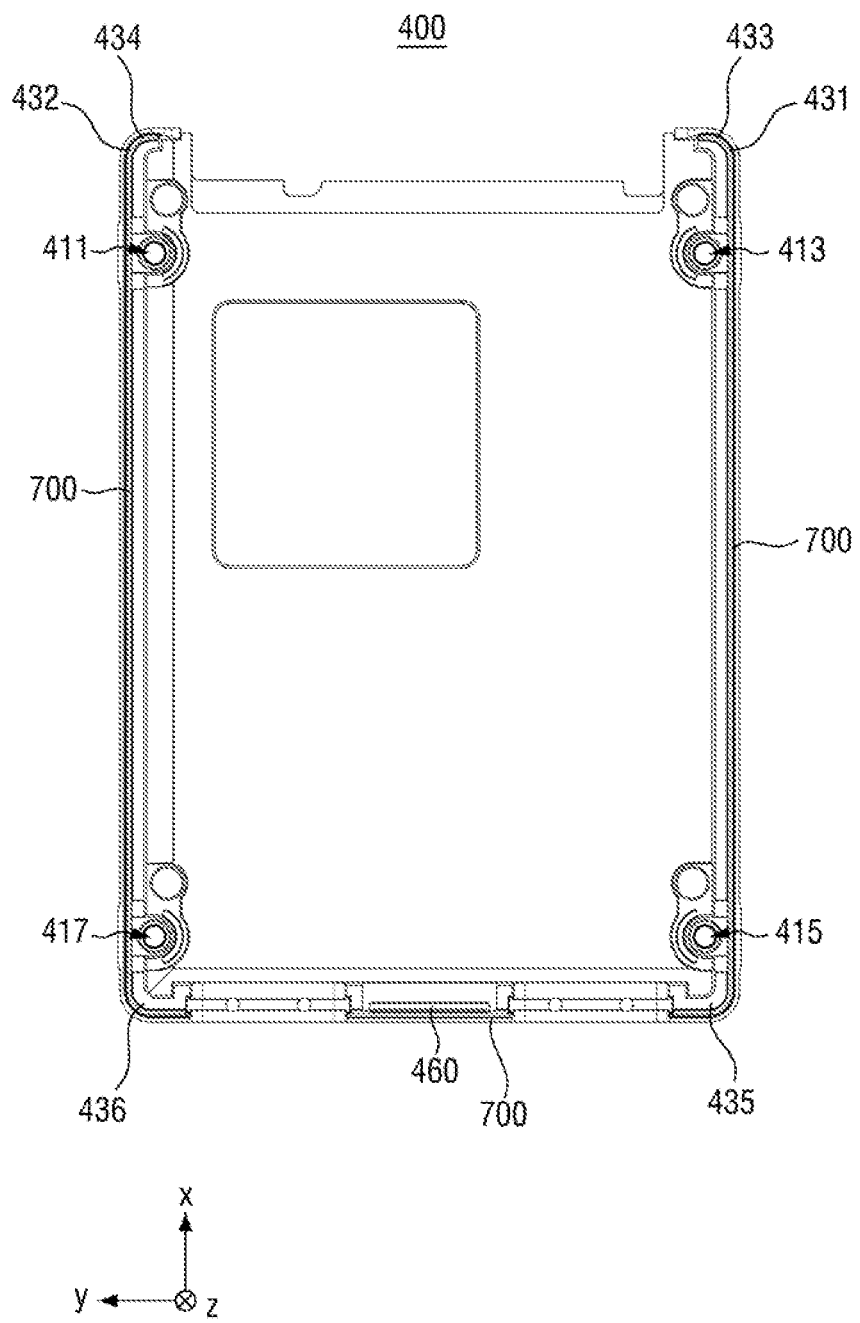

FIG. 11 is an exemplary rear view illustrating the upper plate of the solid state drive device according to exemplary embodiments of the present disclosure. FIG. 12 is an exemplary rear view illustrating the lower plate of the solid state drive device according to exemplary embodiments of the present disclosure.

Referring to FIGS. 11 and 12, unlike FIGS. 7 to 10, in the structure illustrated in FIGS. 11 and 12, the gasket 700 may be formed on the first upper side wall 231, the second upper side wall 232, the first lower side wall 431, the second lower side wall 432, the first to fourth upper bent parts 233, 234, 235, and 236, the first to fourth lower bent parts 433, 434, 435, and 436, the upper support part 260, and the lower support part 460.

At this time, the cross section of the region in which the first upper side wall 231 and the first lower side wall 431 overlap, and/or the region in which the second upper side wall 232 and the second lower side wall 432 overlap, and/or the region in which the upper support part 260 and the lower support part 460 overlap and/or the region in which each of the first to fourth upper bent parts 233, 234, 235, and 236 and each of the first to fourth lower bent parts 433, 434, 435, and 436 overlap may be formed to increase the face area on which the gasket 700 may be formed, as described above.

Hereinafter, a formation structure of the gasket 700, according to exemplary embodiments of the present disclosure, capable of effectively blocking the external electromagnetic waves will be described.

Figure 13:
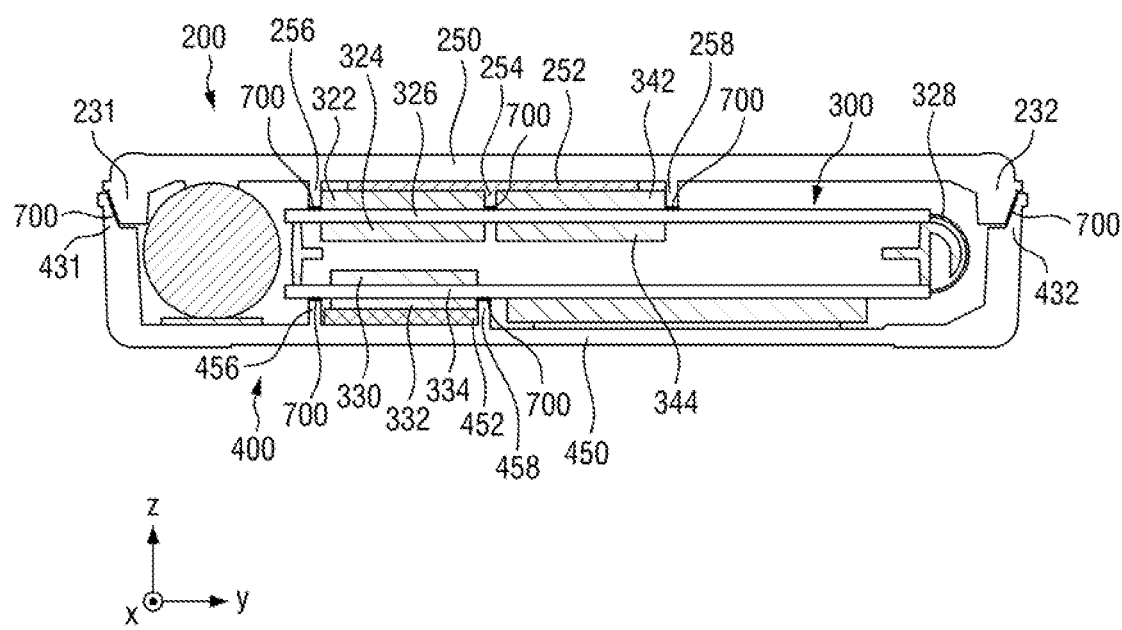
FIG. 13 is a cross-sectional view illustrating the solid state drive device of FIG. 2 taken along a line A-A', according to exemplary embodiments of the present disclosure.
Figure 14:
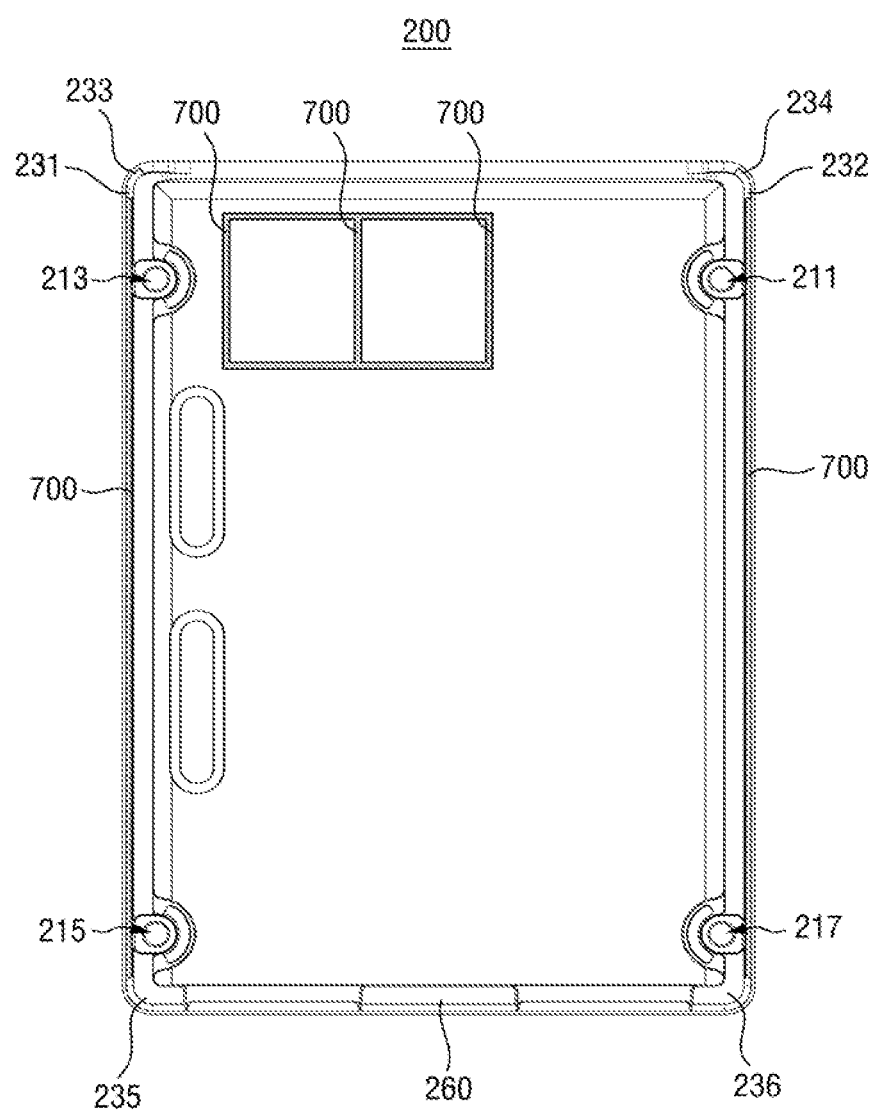
FIG. 14 is an exemplary rear view illustrating an upper plate of the solid state drive device according to exemplary embodiments of the present disclosure.
Figure 15:
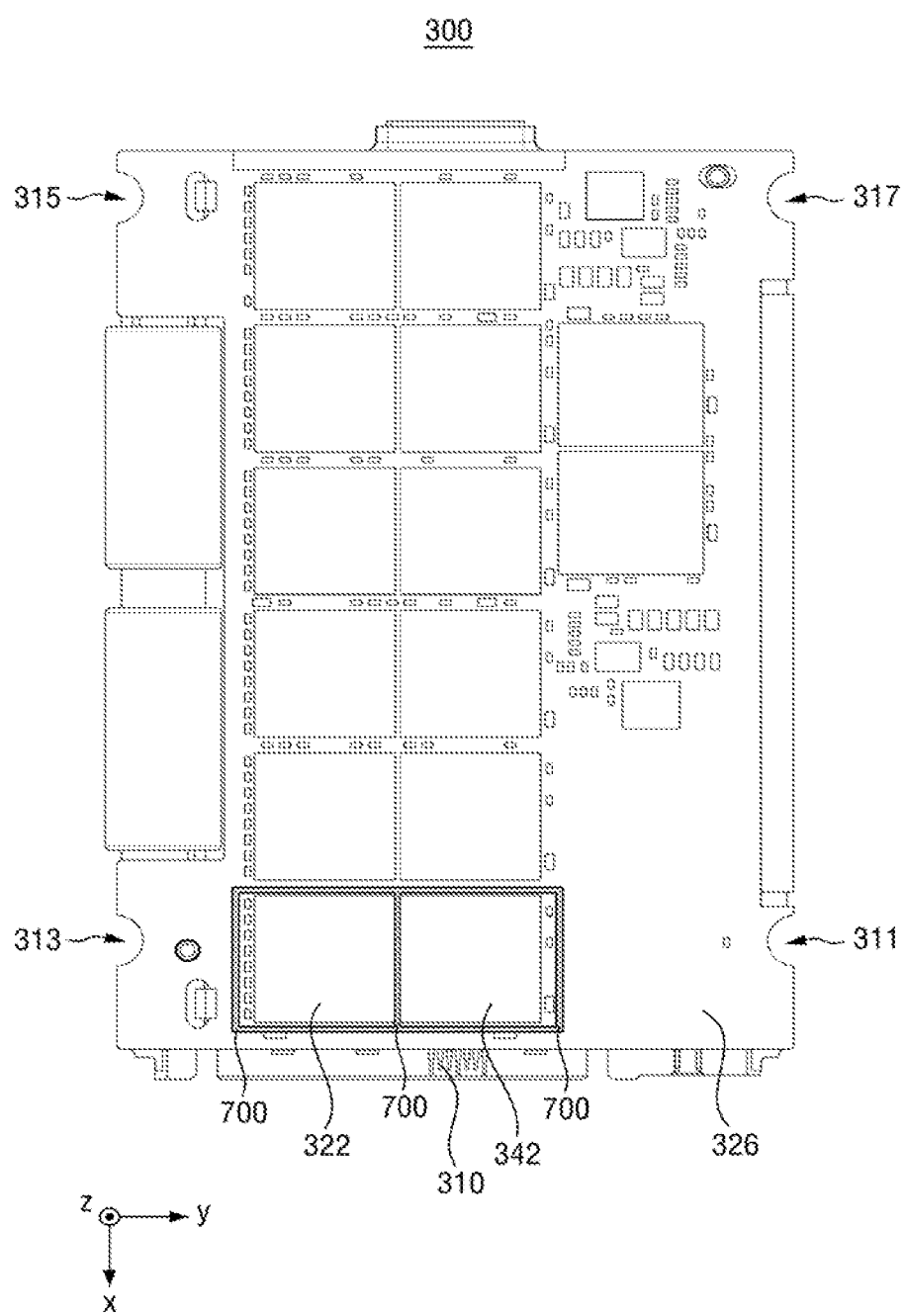
FIG. 15 is an exemplary top view illustrating a package module of the solid state drive device according to exemplary embodiments of the present disclosure.
Figure 16:
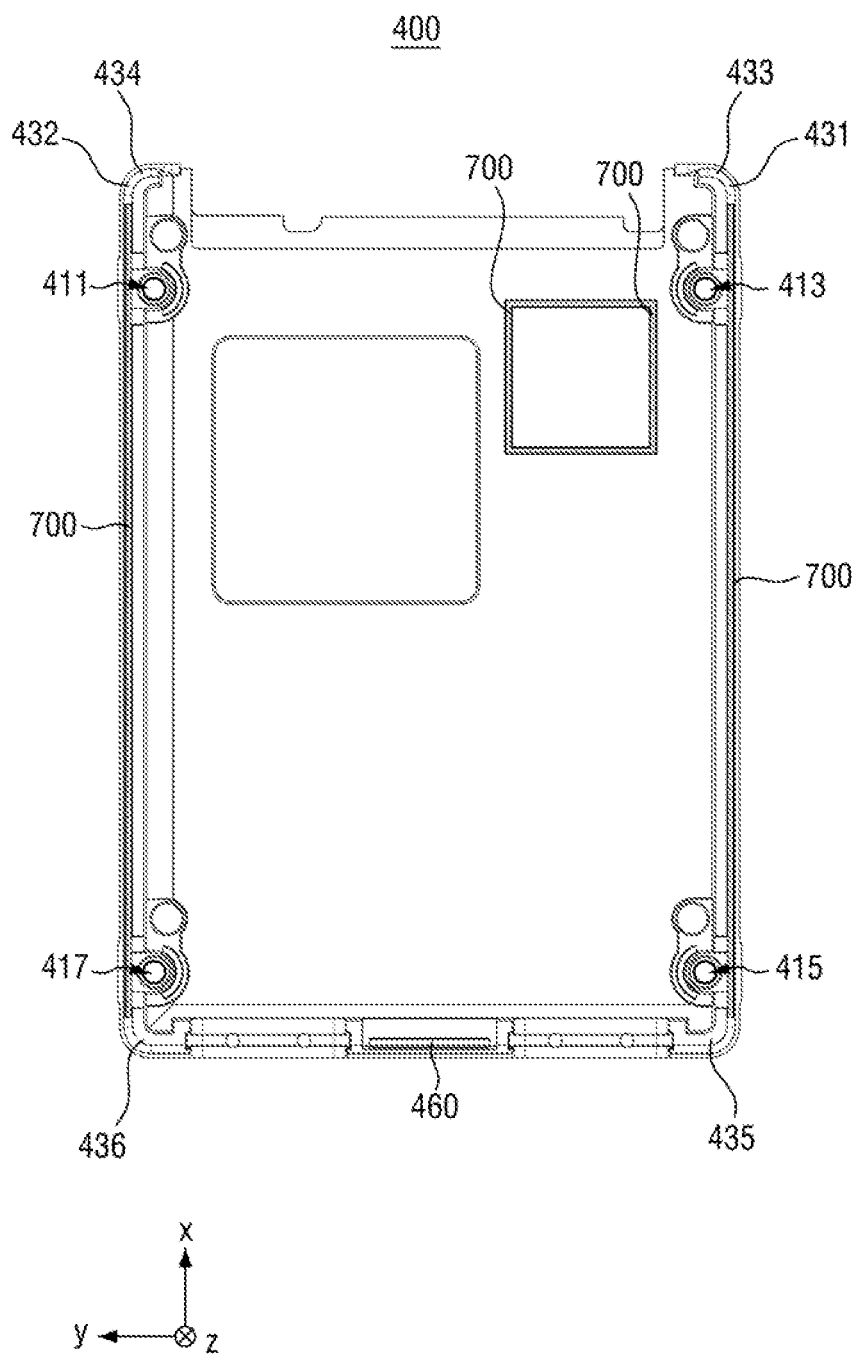
FIG. 16 is an exemplary rear view illustrating a lower plate of the solid state drive device according to exemplary embodiments of the present disclosure.
Figure 17:
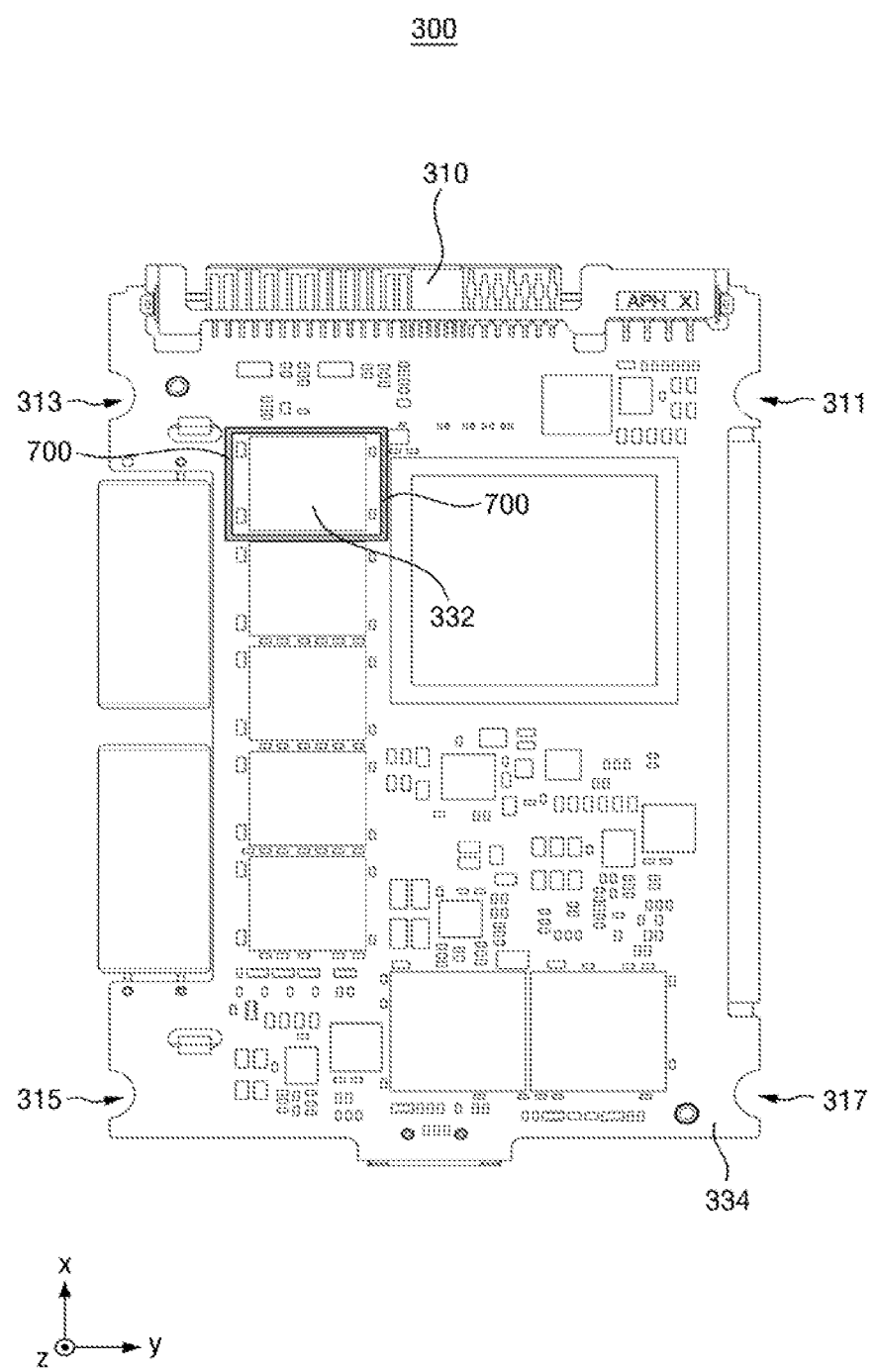
FIG. 17 is an exemplary bottom view illustrating a package module of the solid state drive device according to exemplary embodiments of the present disclosure.

FIG. 13 is a cross-sectional view illustrating the solid state drive device of FIG. 2 according to exemplary embodiments of the present disclosure taken along a line A-A'. FIG. 14 is an exemplary rear view illustrating the upper plate of the solid state drive device according to exemplary embodiments of the present disclosure. FIG. 15 is an exemplary top view illustrating a package module of the solid state drive device according to exemplary embodiments of the present disclosure. FIG. 16 is an exemplary rear view illustrating a lower plate of the solid state drive device according to exemplary embodiments of the present disclosure. FIG. 17 is an exemplary bottom view illustrating a package module of the solid state drive device according to exemplary embodiments of the present disclosure.

Referring to FIG. 13, the upper flat part 250 of the upper plate 200 of the solid state drive device, according to exemplary embodiments of the present disclosure, includes a first upper protruding part 256 and a second upper protruding part 258 that protrude in the second direction (e.g. the negative z direction). Also, the upper heat transfer member 252 includes an upper heat transfer member protruding part 254 protruding in the second direction (e.g. the negative z direction). The first upper protruding part 256, the second upper protruding part 258, and the upper heat transfer member protruding part 254 may surround the first semiconductor chip 322 and the third semiconductor chip 342.

The gasket 700 may be formed on uppermost faces in the second direction (e.g. the negative z direction) of each of the first upper protruding part 256, the second upper protruding part 258 and the upper heat transfer member protruding part 254. The gasket 700 may be formed between the upper package substrate 326 and the uppermost faces in the second direction (e.g. the negative z direction) of each of the first upper protruding part 256, the second upper protruding part 258 and the upper heat transfer member protruding part 254 to more efficiently shield the first semiconductor chip 322 and the third semiconductor chip 342 from external electromagnetic waves.

The shape and number of the upper protruding parts and the upper heat transfer member protruding parts are not necessarily limited thereto.

Referring to FIG. 14, the gasket 700 may surround the first semiconductor chip 322 and the third semiconductor chip 342. Therefore, the first semiconductor chip 322 and the third semiconductor chip 342 may be more efficiently shielded from external electromagnetic waves.

Referring to FIG. 15, the gasket 700 may surround the first semiconductor chip 322 and the third semiconductor chip 342. Therefore, the first semiconductor chip 322 and the third semiconductor chip 342 may be more efficiently shielded from external electromagnetic waves.

The shape in which the gasket 700 surrounds the first semiconductor chip 322 and the third semiconductor chip 342 is not necessarily limited thereto. Further, the gasket 700 may also surround to shield semiconductor chips other than the first semiconductor chip 322 and the third semiconductor chip 342.

Referring to FIG. 13 again, the lower flat part 450 of the lower plate 400 of the solid state drive device, according to exemplary embodiments of the present disclosure, has a first lower protruding part 456 and a second lower protruding 458 protruding in the first direction (e.g. the positive z direction). The first lower protruding part 456 and the second lower protruding part 458 may surround a fifth semiconductor chip 332.

The gasket 700 may be formed on the uppermost faces of each of the first lower protruding part 456 and the second lower protruding part 458. The gasket 700 may be formed between the lower package substrate 334 and the uppermost faces in the second direction (e.g. the negative z direction) of each of the first lower protruding part 456 and the second lower protruding part 458 to more efficiently shield the fifth semiconductor chip 332 from external electromagnetic waves.

The shape and number of the lower protruding parts and the lower heat transfer member protruding parts are not necessarily limited thereto.

Referring to FIG. 16, the gasket 700 may surround the fifth semiconductor chip 332. Therefore, the fifth semiconductor chip 332 can be more efficiently shielded from external electromagnetic waves.

Referring to FIG. 16, the gasket 700 may surround the fifth semiconductor chip 332. Therefore, the fifth semiconductor chip 332 can be more efficiently shielded from external electromagnetic waves.

The shape in which the gasket 700 surrounds the fifth semiconductor chip 332 is not necessarily limited thereto. Further, the gasket 700 may also surround to shield semiconductor chips other than the fifth semiconductor chip 332.

Figure 18:
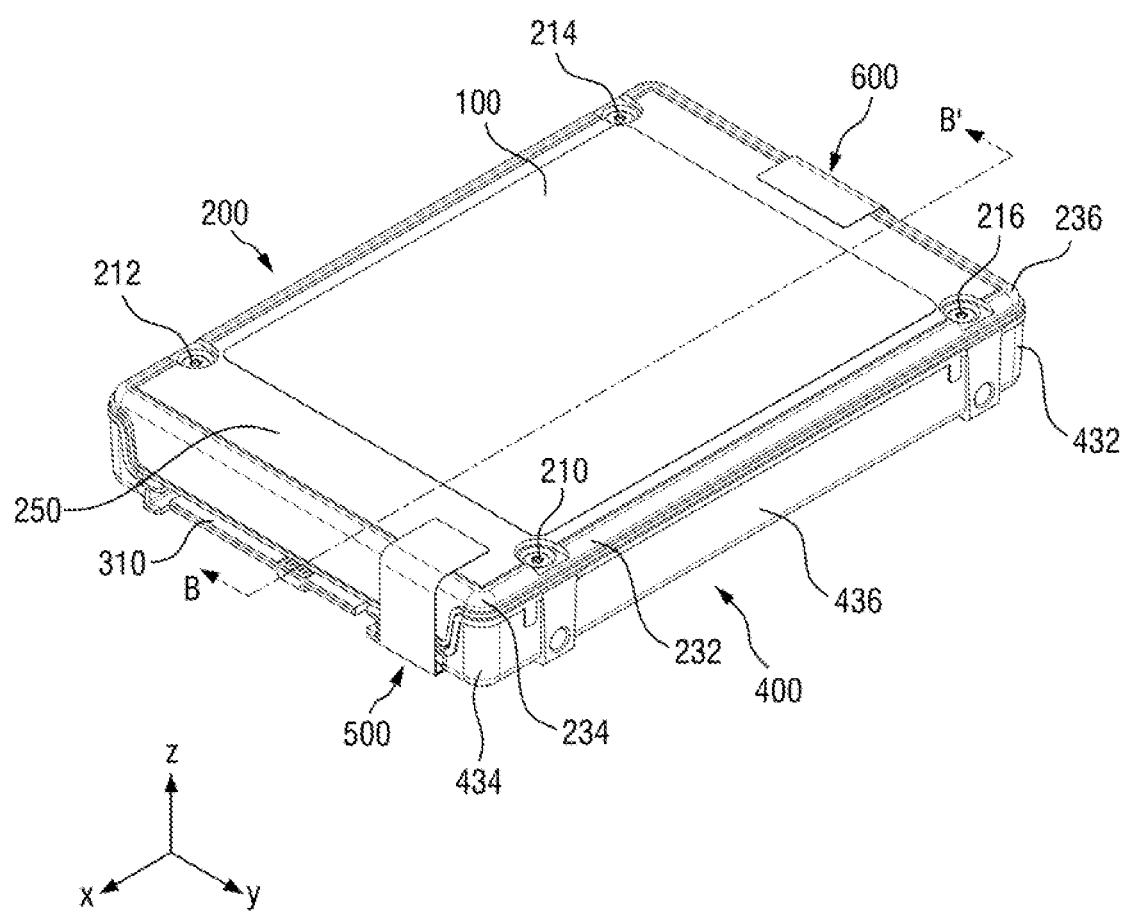
FIG. 18 is a perspective view illustrating a solid state drive device according to exemplary embodiments of the present disclosure.
Figure 19:
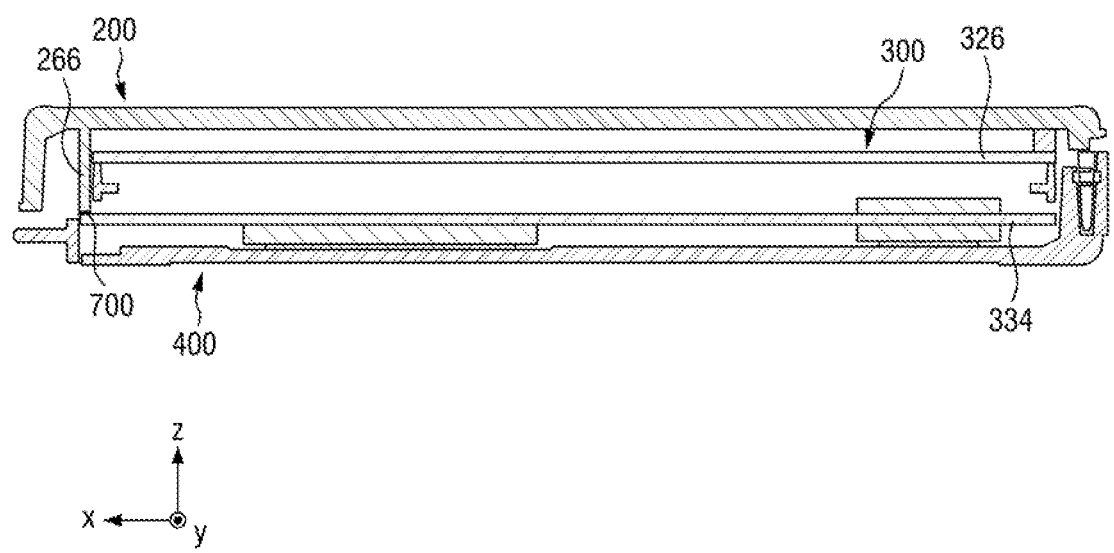
FIG. 19 is a cross-sectional view illustrating the solid state drive device of FIG. 18, taken along a line B-B', according to exemplary embodiments of the present disclosure.
Figure 20:
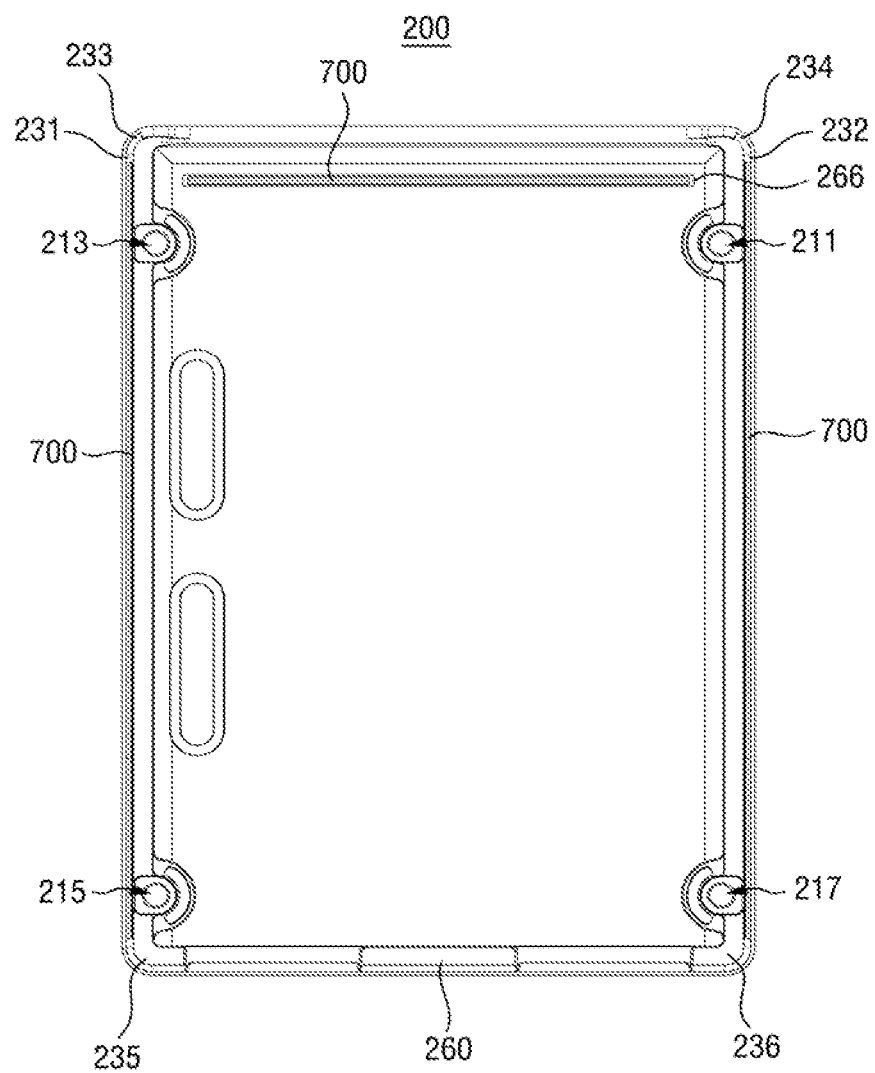
FIG. 20 is an exemplary rear view illustrating an upper plate of the solid state drive device according to exemplary embodiments of the present disclosure.

FIG. 18 is a perspective view illustrating the solid state drive device according to exemplary embodiments of the present disclosure. FIG. 19 is a cross-sectional view illustrating the solid state drive device of FIG. 18 according to exemplary embodiments of the present disclosure, taken along a line B-B'. FIG. 20 is an exemplary rear view illustrating the upper plate of the solid state drive device according to exemplary embodiments of the present disclosure. For reference, the repeated explanation of the aforementioned contents will not be provided. It may be assumed that elements that are not described below are at least similar to corresponding elements that have been described elsewhere in the present disclosure.

Referring to FIGS. 18 to 20, the upper plate 200 may further include an upper shielding part 266 protruding in the negative z direction. Therefore, the upper shielding part 266 may shield the package module 300 to more effectively shield EMI flowing from the outside.

While exemplary embodiments of the embodiments of the present invention have been described with reference to the accompanying drawings, the present invention is not necessarily limited to the above embodiments, and may be manufactured in various different forms. Those skilled in the art will appreciate that the present invention may be implemented in other specific forms without changing the technical idea and essential features of the present invention. Accordingly, it should be understood that the embodiments described above are illustrative rather than being limited in all aspects.

What is claimed is:

1. A solid state drive device, comprising:
 a lower plate including a lower flat part, and a lower side wall protruding from the lower flat part primarily in a first direction;
 an upper plate including an upper flat part facing the lower flat part, and an upper side wall protruding from the upper flat part primarily in a second direction opposite to the first direction;
 a gasket including a metal material disposed in at least a part of a region in which the lower side wall and the upper side wall overlap each other;
 a solid state memory device mounted between the tower plate and the upper plate; and
 a package module disposed between the upper plate and the lower plate,
 wherein the package module comprises an upper package substrate, and the solid state memory device comprises a semiconductor chip disposed on at least a part of one face on which the upper package substrate faces the upper flat part, and
 wherein the gasket surrounds the semiconductor chip.

2. The solid state drive device of claim 1, wherein the gasket further comprises asbestos and/or graphite.

3. The solid state drive device of claim 1, wherein the lower plate comprises a lower bent part connected to the lower side wall,
 wherein the upper plate comprises an upper bent part connected to the upper side wall, and wherein the gasket is disposed in at least a part of a region in which the lower bent part and the upper bent part overlap each other.

4. The solid state drive device of claim 3, wherein the lower plate comprises a lower support part protruding in the first direction, and
wherein the gasket is disposed on the lower support part.

5. The solid state drive device of claim 1, wherein the gasket is disposed in 70% or more of a region in which the lower side wall and the upper side wall overlap each other.

6. The solid state drive device of claim 1, wherein the lower flat part comprises a tower protruding part protruding primarily in the first direction, and
wherein the gasket is disposed on an uppermost face, with respect to the first direction, of the lower protruding part.

7. The solid state drive device of claim 6, wherein the upper flat part comprises an upper protruding part protruding primarily in the second direction, and
wherein the gasket is disposed on an uppermost face, with respect to the second direction, of the upper protruding part.

8. The solid state drive device of claim 1, wherein the lower side wall comprises a lower inclined face having an inclination at a first angle with respect to the second direction,
wherein the upper side wall comprises an upper inclined face having an inclination at a second angle with respect to the first direction, and
wherein the gasket is disposed in at least a part of a region in which the lower inclined face and the upper inclined face overlap each other.

9. The solid state drive device of claim 1, wherein the lower side wall comprises a lower side wall protruding part which protrudes primarily in the first direction, and a lower side wall accommodating part which is recessed with respect to the second direction,
wherein the upper side wall comprises an upper side wall protruding part which protrudes primarily in the second direction, and an upper side wall accommodating part which is recessed with respect to the first direction,
wherein the lower side wall accommodating part accommodates the upper side wall protruding part,
wherein the upper side wall accommodating part accommodates the lower side wall protruding part, and
wherein the gasket is disposed in at least a part of a region in which the lower side wall accommodating part and the upper side wall protruding part overlap each other, and a region in which the upper side wall accommodating part and the lower side wall protruding part overlap each other.

10. A solid state drive device, comprising:
a package module including a solid state memory device;
an upper plate disposed on one face of the package module, the tipper plate surrounding at least a part of the package module; and
a lower plate disposed on a face facing the one face of the package module and surrounds at least a pan of the package module,
wherein a gasket including a metal material is disposed in at least a part of a region in which the upper plate and the lower plate overlap each other, on a side wall perpendicular to the one face and a back face of the package module,
wherein the lower plate comprises a lower bent part connected to a lower side wall,
wherein the upper plate comprises an upper bent part connected to an upper side wall, and
wherein the gasket is disposed in at least a part of a region in which the lower bent part and the upper bent part overlap each other.

11. The solid state drive device of claim 10, wherein the upper plate comprises an upper flat part, and the upper side wall protruding from the upper flat part in a first direction,
wherein the lower plate comprises a lower flat part, and the lower side wall protruding from the lower flat part primarily in a second direction which is opposite to the first direction, and
wherein the gasket is disposed in at least a part of a region in which the upper side wall and the lower side wall overlap each other.

12. The solid state drive device of claim 11, wherein the upper flat part comprises an upper protruding part which protrudes primarily in the first direction, and
wherein the gasket is disposed on an uppermost face, with respect to the first direction, of the upper protruding part.

13. The solid state drive device of claim 10, wherein the gasket is disposed in 70% or more of a region in which the lower plate and the upper plate overlap each other.

14. The solid state drive device of claim 10, wherein the upper plate comprises an upper inclined face having an inclination at a first angle with respect to the first direction in a region in which the gasket is disposed, and
wherein the lower plate comprises a lower inclined face having an inclination at a second angle with respect to a second direction which is opposite to the first direction in the region in which the gasket is disposed.

15. The solid state drive device of claim 10, wherein the upper plate comprises a lower side wall protruding part which protrudes primarily in the first direction and a lower side wall accommodating part recessed with respect to the second direction opposite to the first direction, in the region in which the gasket is disposed,
wherein the lower plate comprises an upper side wall protruding part which protrudes primarily in the second direction and an upper side wall accommodating pan recessed with respect to the first direction, in the region in which the gasket is disposed,
wherein the lower side wall accommodating part accommodates the upper side wall protruding part, and
wherein the upper side wall accommodating part accommodates the lower side wall protruding part.

16. The solid state drive device of claim 15, wherein there are at least two of the upper side wall protruding part and there are at least two of the lower side wall protruding part.

17. The solid state drive device of claim 10, wherein the upper plate comprises an upper shielding part protruding primarily in the first direction, and the upper shielding part surrounds the package module.

18. A solid state drive device, comprising:
a lower plate which includes a lower flat part, a first lower side wall and a second lower side wall protruding from the lower flat part primarily in a first direction and facing each other, first and second lower bent parts connected to both ends of the first lower side wall, third and fourth lower bent parts connected to both ends of the second lower side wall, first and second screw accommodating parts disposed on the first lower side wall, third and fourth screw accommodating parts disposed on the second lower side wall, and a lower support part disposed between the second lower bent part and the fourth lower bent part;

a package module including first to fourth screw passage parts configured to accommodate the first to fourth screw accommodating parts, respectively, an upper package substrate including a first semiconductor chip and a second semiconductor chip on both faces thereof, a lower package substrate facing the upper package substrate and including a third semiconductor chip and a forth semiconductor chip on both faces thereof, and upper and lower connecting members configured to connect the upper package substrate and the lower package substrate, the package module being disposed on the lower plate;

an upper plate which includes an upper flat part including first to fourth screw holes disposed on each of the first to fourth screw accommodating parts, a first upper side wall and a second upper side wall protruding from the upper flat part primarily in a second direction opposite to the first direction, first and second upper bent parts connected to both ends of the first upper side wall, third and fourth upper bent parts connected to both ends of the second upper side wall, and an upper support part disposed between the second upper bent part and the fourth upper bent part, the upper plate being disposed on the package module;

a top cover disposed on the upper plate; and a gasket including a metal material disposed on at least some parts of the first and second lower side walls and the first and second upper side walls.

* * * * *